US006744388B1

(12) United States Patent
Khu

(10) Patent No.: US 6,744,388 B1
(45) Date of Patent: Jun. 1, 2004

(54) HARDWARE-FRIENDLY GENERAL PURPOSE DATA COMPRESSION/ DECOMPRESSION ALGORITHM

(75) Inventor: Arthur H. Khu, San Mateo, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/175,710

(22) Filed: Jun. 19, 2002

(51) Int. Cl.[7] ............................ H03M 7/38; H03M 7/00
(52) U.S. Cl. ......................................... 341/51; 341/50
(58) Field of Search ........................ 341/50, 51; 710/68; 360/8

(56) References Cited

U.S. PATENT DOCUMENTS

| | | | | |
|---|---|---|---|---|
| 5,237,460 A | * | 8/1993 | Miller et al. | 360/8 |
| 5,371,499 A | * | 12/1994 | Graybill et al. | 341/51 |
| 5,729,223 A | * | 3/1998 | Trissel | 341/51 |
| 6,446,145 B1 | * | 9/2002 | Har et al. | 710/68 |

* cited by examiner

*Primary Examiner*—Jean Jeanglaude
(74) *Attorney, Agent, or Firm*—LeRoy D. Maunu; Kim Kanzaki

(57) ABSTRACT

Methods and systems are provided for dynamically compressing and decompressing a data stream in a manner that facilitates hardware implementation. In one aspect, a compression system identifies literal data sequences of variable length in the data stream and characterizes each literal sequence with an indicator that is inserted into the data stream. Sequences that repeat previous sequences in the data stream are identified and replaced with codes characterizing the repeating sequence. Another aspect provides a decompression method and system for removing indicators inserted by the compression system and replacing codes in the data stream with the repeating sequences characterized by the codes.

58 Claims, 8 Drawing Sheets

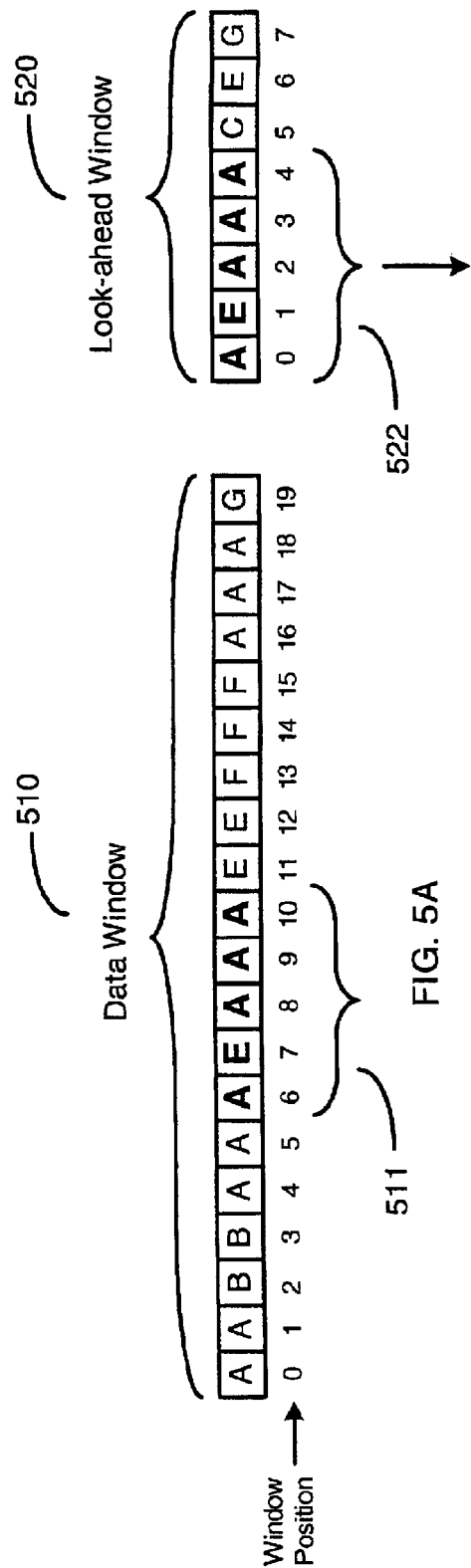
FIG. 5A
FIG. 5B
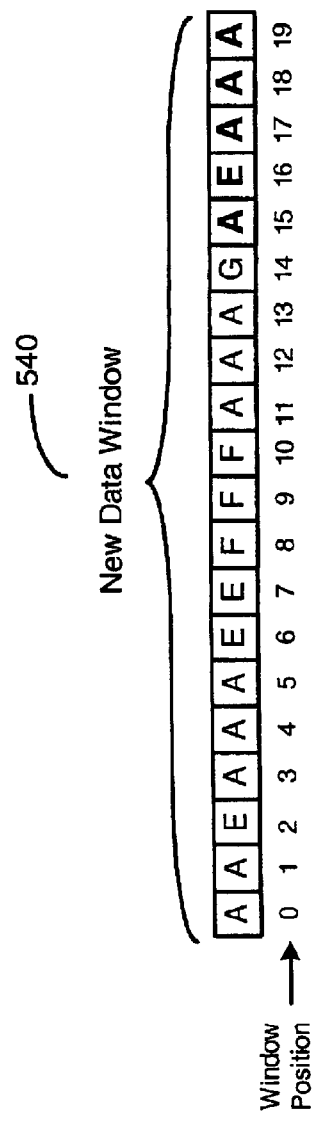
FIG. 5C
FIG. 5D

HARDWARE-FRIENDLY GENERAL PURPOSE DATA COMPRESSION/ DECOMPRESSION ALGORITHM

FIELD OF THE INVENTION

The present invention generally relates to compressing and decompressing a data stream, and more particularly to a method for compressing and decompressing a data stream that is more easily implemented in hardware.

BACKGROUND

Data compression and decompression techniques remove redundancy in a data stream to provide more efficient utilization of memory and communication channel resources. Lossless compression methods are used for data streams that require the original data to be exactly reconstructed from the compressed data stream without any loss of information. One category of lossless compression algorithms, generally termed LZ compression, relies on substitution of a code for a frequently repeating data pattern.

One group of LZ compression algorithms dynamically creates a table of frequently encountered data patterns as the data stream is compressed. Code sequences indicating the location in the table of the frequently encountered data patterns are generated and embedded in the data stream. The table is added by the compression system as part of the compressed data stream for use by the decompression system to decompress the compressed data stream.

Another group of LZ compression algorithms does not add a table of frequently repeated sequences to the data stream. Instead, the decompression system dynamically recreates the repeating data patterns by copying a specified number of data units starting from a buffer location specified by codes embedded in the compressed data stream.

Both groups of LZ compression algorithms send uncompressed literal data that is not part of a repeating pattern from the compression system to the decompression system. A data type flag is typically incorporated into the data stream to indicate whether a particular data unit is code or literal data, resulting in a non-integral data unit size. In compression systems using a byte as the data unit, a data type flag must be added to each data byte by the compression system, resulting in each data byte represented by 9 bits, including 8 bits of data and the data type flag. The decompression system for this compressed data stream must strip out the data type flag and repack the data stream into bytes to reconstruct the original data.

SUMMARY OF THE INVENTION

In various embodiments, a method and apparatus are provided for compressing and decompressing a data stream in a manner that is more easily implemented in hardware.

One aspect of the present invention provides a method and system for replacing repeating sequences in the data stream with codes. The codes characterize a repeating sequence by indicating the location and length of an identical sequence in the data stream. Indicators are inserted into the data stream characterizing the length of non-repeating sequences of data.

In another aspect of the invention, a decompression method and system are provided The decompression method and system removes the indicators inserted by the compression system from the data stream, each indicator characterizes a non-repeating sequence of variable length. Codes inserted into the data stream by the compression system are replaced with the repeating sequences characterized by the codes.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 5A illustrates a literal data sequence in a data window of a data stream;

FIG. 5B illustrates a repeating sequence in a look-ahead window of the data stream found in the data window;

FIG. 5C illustrates a data window after a repeating sequence is encoded in accordance with an embodiment of the invention;

FIG. 5D illustrates a look-ahead window after new data is added to replace a repeating sequence encoded in accordance with an embodiment of the invention;

DETAILED DESCRIPTION

Various embodiments of the present invention are described in terms of compressing and decompressing a data stream in a manner that facilitates hardware implementation. The present invention provides a compression method and system, and an associated decompression method and system. The compression and decompression methods and systems provided by the invention may be advantageously used for more efficient data storage and/or transmission.

The present invention is believed to be applicable to a variety of processes and systems within the technology areas of data communication and storage. The invention is believed to be particularly beneficial for configuring programmable logic devices. Configuration data for complex programmable logic devices (CPLDs) and field programmable gate arrays (FPGAs) can be compressed and stored in less expensive, lower density storage devices.

Previous compression/decompression techniques use a flag bit to identify each data unit (e.g., a byte) as either a code data unit or a literal data unit. By previous techniques, the compression system inserts a data type flag into the data stream to identify the data type for each data unit. Adding type flags forces the compression system to take bits from the following code or literal data units to incorporate the type flag to make a whole data unit. The remaining bits are added to bits from the next data unit to form a byte, and so on. The decompression system is required to strip out the flags and reassemble the data into integral data units (e.g., bytes). These techniques require circuitry in the compression system to insert the flag bits and form data units, and also circuitry in the decompression system to remove the flag bits and regenerate the data units.

The present invention provides methods of compression and decompression allowing the data to be manipulated by bytes, or by any other logical data unit (e.g., words), thereby simplifying hardware implementation relative to previous techniques. Additionally, the present invention identifies compressed data sequences using an actual buffer or FIFO address rather than a logical address, further reducing the required hardware.

Those skilled in the art will appreciate that the invention may be used in a wide variety of technology areas to conserve memory space and/or make more efficient use of communication channel capacity. The invention may be applied to a variety of programmable devices and adapted to a number of applications to increase the effective memory storage in a programmable device or to enhance communication bandwidth.

Figure 1:
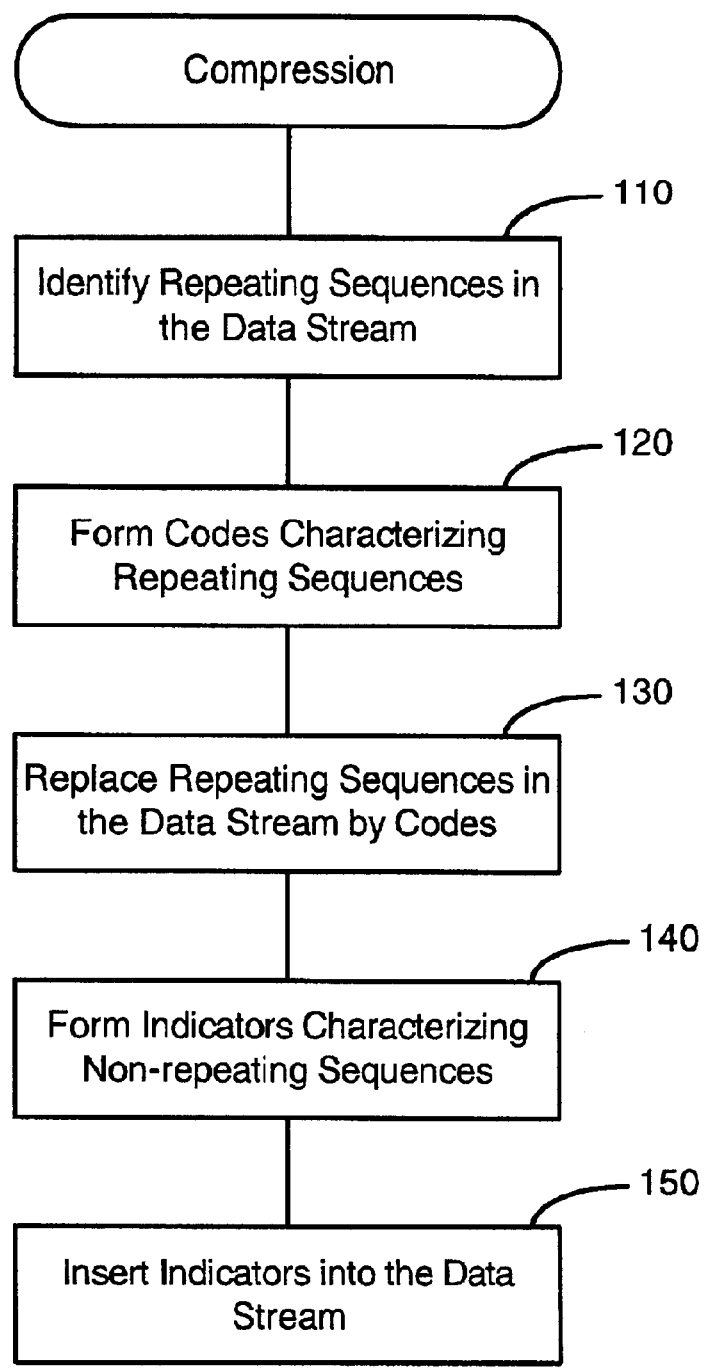
FIG. 1 is a diagram conceptually illustrating a method for compressing a data stream in accordance with an embodiment of the invention.

FIG. 1 is a diagram conceptually illustrating, in broad and general terms, a compression method of an embodiment of the present invention. Although the blocks of the diagram are presented in a particular order, it is not necessary to perform the operations described in the blocks in the particular order presented in FIG. 1. Furthermore, some operations may be performed simultaneously.

Repeating sequences in a data stream are identified 110. The repeating sequences are characterized by codes indicating the length of the repeating sequence and the location of an identical sequence in the data stream 120. The repeating sequences are replaced in the data stream by the codes 130. Non-repeating sequences are characterized using indicators 140 providing the length the non-repeating sequences. The indicators characterizing the non-repeating sequences are inserted into the data stream 150.

Figure 2:
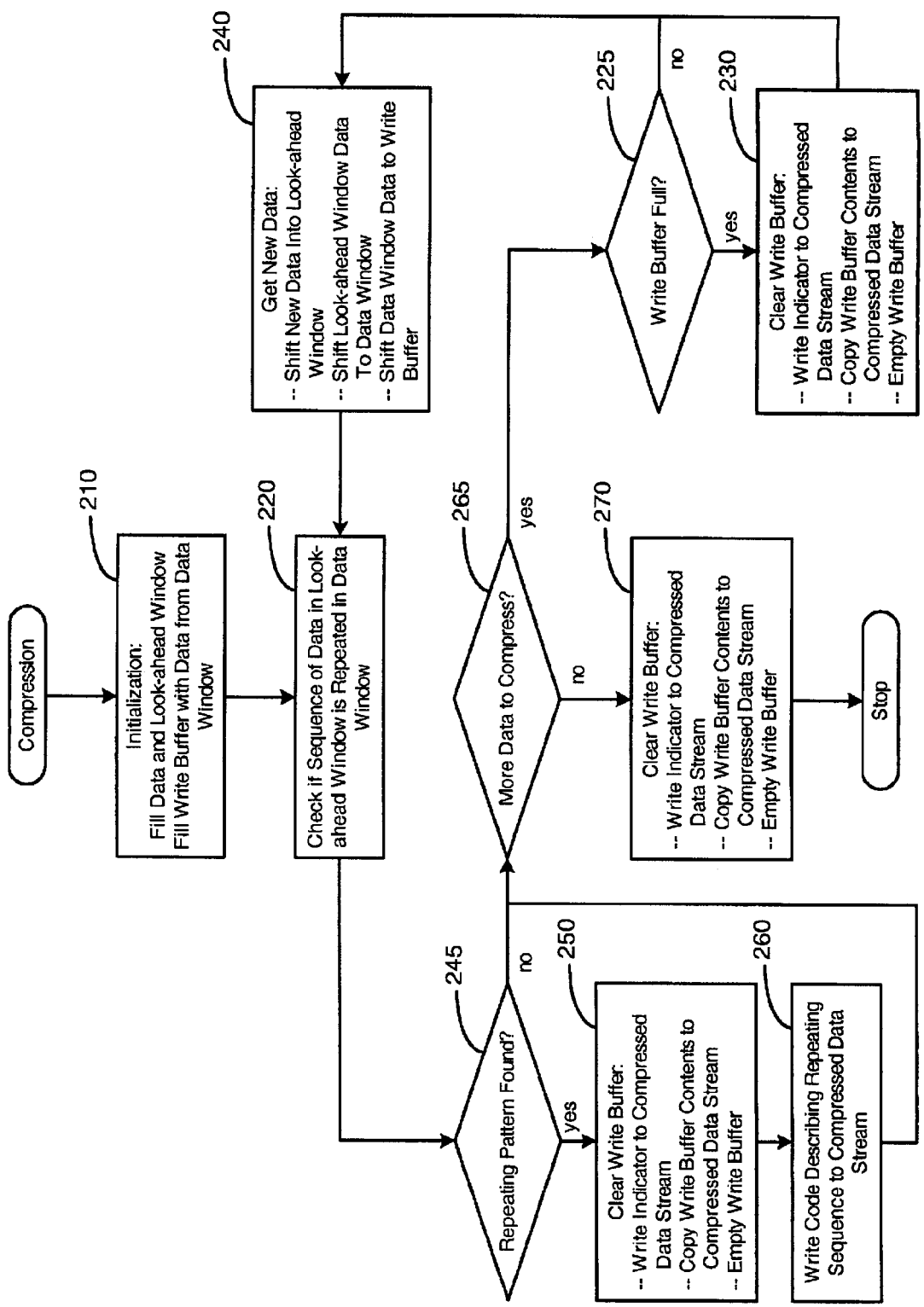
FIG. 2 is a flowchart illustrating a method for compressing a data stream, in accordance with an embodiment of the invention.

FIG. 2 is a more detailed flowchart illustrating a compression method of the present invention. Although the blocks of the diagram are presented in a particular order, it is not necessary to perform the operations described in the blocks in the particular order presented in FIG. 2. Furthermore, some operations may be performed simultaneously.

The compression method is implemented using two sliding windows to hold the data stream or data block to be compressed. The two sliding windows are implemented, for example, as memory buffers, or as first-in-first-out (FIFO) registers. The first sliding window is denoted the data window and the second sliding window is denoted the look-ahead window. Additionally, a write buffer may be used as a temporary data storage buffer.

The two sliding windows and the write buffer are initialized 210. The initialization may include filling the data and look-ahead windows with data from the data stream and filling the write buffer with data from the data window. Data in the look-ahead window is compared to data in the data window. Sequences in the look-ahead window that repeat an identical sequence in the data window are identified 220. The repeating sequence may be required to have a minimum length, such as 3 bytes. Furthermore, it may be required that the length and location of the repeating sequence can be defined by a predetermined number of data units, for example, 2 bytes.

If a repeating sequence is found 245, the look-ahead window contains a sequence that repeats a sequence in the data window. The write buffer is cleared 250. Clearing the write buffer requires writing an indicator describing the number of data units in the write buffer to the compressed data stream. These data units are considered a non-repeating sequence. The indicator containing the non-repeating sequence length is described in whole data units. For example, an 8-bit byte can have the most significant bit set to 0 to indicate that a literal sequence is being defined, and the lower 7 bits used to specify the length of the data literal sequence. The contents of the write buffer are copied to the compressed data stream and the write buffer is emptied.

A code characterizing the repeating sequence in the look-ahead window is written to the compressed data stream 260. The code includes 1) a code flag indicating a repeating data sequence has been compressed, 2) an address in the data window where the repeating sequence may be located, and 3) the length of the repeating sequence. The repeating sequence is replaced in the data stream by the code. The code is represented in whole data units. For example, two 8-bit bytes can be used to represent the compressed data code: the most significant bit of the first byte can be set to 1 to indicate that a repeating data sequence has been found; the remaining 7 bits to indicate the length of the repeating sequence, and the next byte to indicate the position of the repeating data sequence within the data window.

If a repeating sequence is not found 245, and there is still more data to compress 265, the write buffer is checked to determine if the write buffer is full 225. If the write buffer is not full 225, new data is shifted into the look-ahead window, the look-ahead data is shifted into the data window and the write buffer is filled with data from the data window 240. If the write buffer is full, the write buffer is cleared 230 as described above.

The process described in blocks 210–265 continues until there is no more data to compress 265. If there is no more data to compress 265., the write buffer is cleared 270 and the process is complete.

Figure 3:
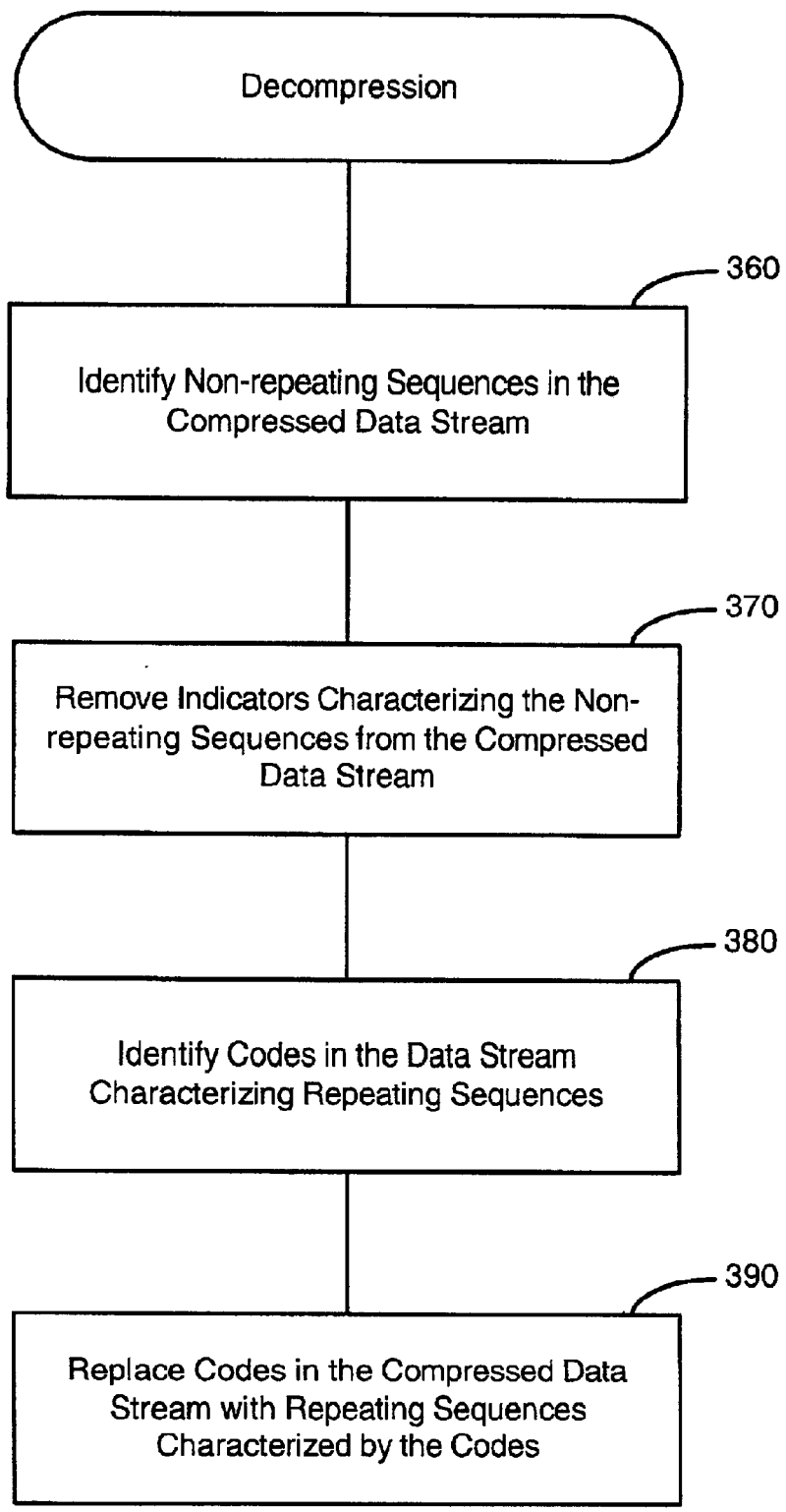
FIG. 3 is a diagram conceptually illustrating a method for decompressing a data stream in accordance with an embodiment of the invention.

A decompression method in accordance with an embodiment of the invention is conceptually illustrated, in broad and general terms, in the diagram of FIG. 3. A data stream compressed by the method discussed above may be dynamically decompressed. Non-repeating sequences in the data stream are identified 360 by indicators inserted in the data stream by the compression method discussed above. The indicators characterizing the non-repeating sequences are removed from the compressed data stream 370. Codes characterizing repeating sequences are identified in the compressed data stream 380. The codes are replaced with the repeating sequences characterized by the codes 390.

Figure 4:
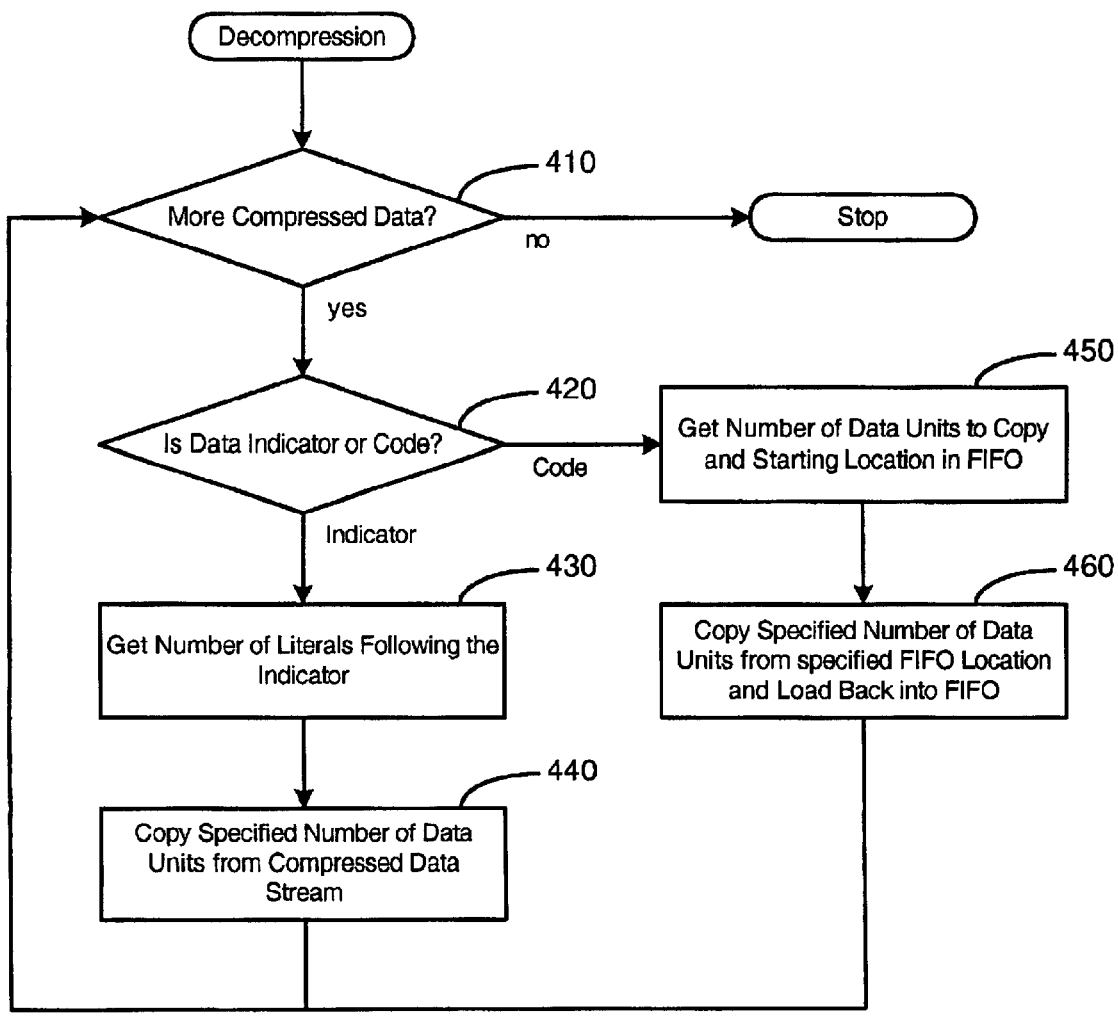
FIG. 4 is a flowchart illustrating a method for decompressing a data stream in accordance with an embodiment of the invention.

FIG. 4 is a more detailed flowchart illustrating a decompression method of the invention. The first data unit of the compressed data stream transferred to the decompression system is either an indicator or code 420. If the data unit is an indicator, then the length of the literal sequence is extracted from the indicator 430 and the specified number of literals is loaded from the compressed data stream into a sliding window or FIFO 440.

If the data unit is code, then the sequence length and sliding window location of the repeating data sequence are extracted from the code units 450. The decompressor replaces the codes by copying the specified number of data units starting from the specified sliding window location to the sliding window 460. After reading the specified number of literals from the compressed data stream or copying the specified number of data units from the sliding window, the next data unit is checked to determine if the next data unit is an indicator or a code. The process defined by blocks 420–460 is repeated until there is no more compressed data 410 and the process ends.

Every data unit loaded into the decompressor sliding window is decompressed data. The decompressed data does not have to be repacked into data units because indicators and code bytes were inserted as whole data units.

An example of the compression process of the present invention is illustrated in FIGS. 5A–5D. In this example, the data and look-ahead windows are represented with lengths of 20 bytes and 8 bytes, respectively, although other window lengths may be used. Furthermore, although an 8-bit byte is used as a data unit in this example, the data unit may be chosen to be any convenient length.

FIG. 5A illustrates the state of a 20-byte sliding data window 510 at a first moment in time, $t_1$. The data window 510 contains the literal sequence AABBAAAEAAAEEFF-FAAAG. An 8-byte look-ahead window 520 at time $t_1$ is illustrated in FIG. 5B. The data window 510 is searched for a sequence of minimum length, for example, 3 bytes, that is repeated by a sequence in the look-ahead window 520 beginning with the character A located in look-ahead position 0.

In this example, a 5-byte sequence, AEAAA 522, located in the look-ahead window 520 at look-ahead window positions 0–4 repeats a sequence 511 in the data window located at data window positions 6–10. The sequence AEAAA 522 in the look-ahead window 520 represents a repeating sequence that may be encoded using a two byte code including the location and the length of the repeating sequence. In this example, the repeating sequence may be characterized by the n-tuple (6,5) 530, where 6 represents the location of the repeating sequence in the: data window, and 5 indicates the length of the repeating sequence.

FIG. 5C illustrates the state of the data window 540 at a second moment in time, $t_2$. After the repeating sequence AEAAA has been identified and encoded by the process described above, 5 bytes from the look-ahead window are shifted into the data window. FIG. 5D illustrates the condition of the look-ahead window at time $t_2$. Five bytes of new data, HHHHE 550, have been shifted into the look-ahead window 560, as illustrated in FIG. 5D, and the process of examining the data window 540 for a repeating sequence beginning at look-ahead window 560 position 0 is continued.

Figure 6:
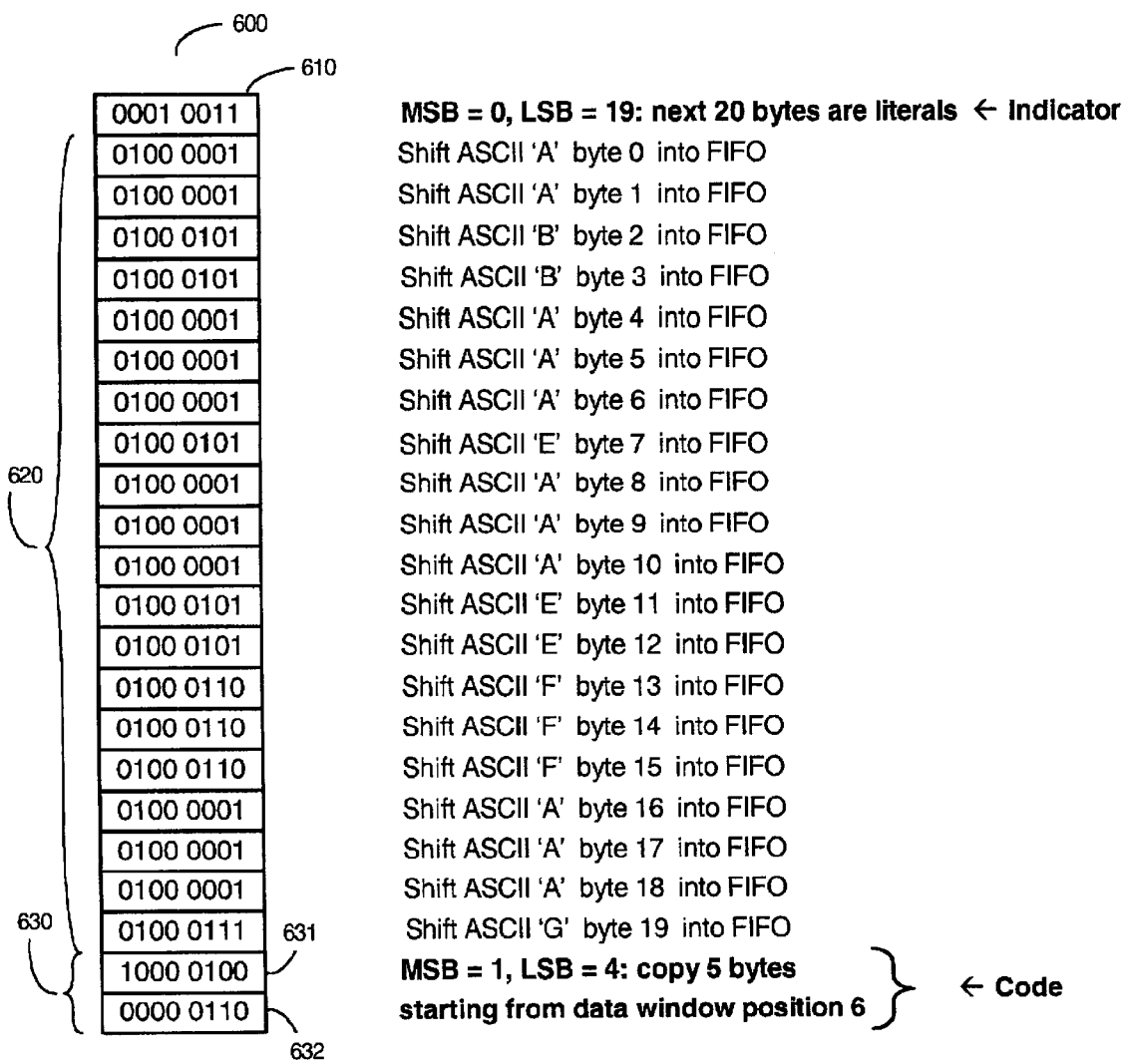
FIG. 6 illustrates a compressed data stream in accordance with an embodiment of the invention.
Figure 7A:
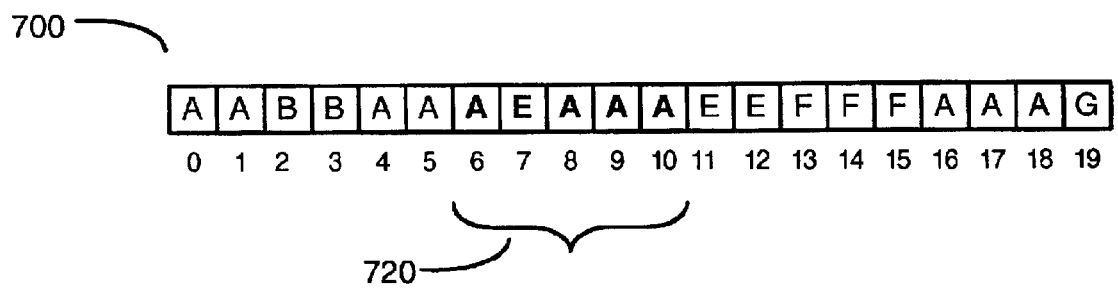
FIGS. 7A and 7B illustrate a decompressed data stream in accordance with an embodiment of the invention.
Figure 7B:
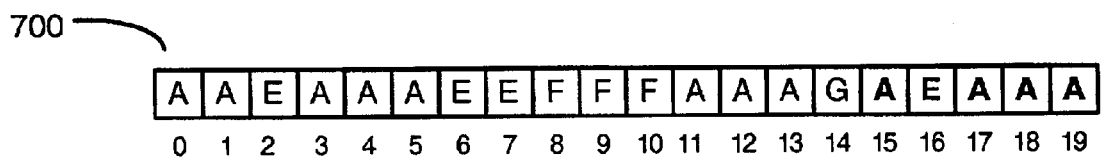

An example of decompression in accordance with an embodiment of the invention is illustrated by a compressed data stream in FIG. 6 and a decompression FIFO in FIGS. 7A and 7B. The decompression example is based on the compressed data example discussed in the preceding paragraphs. During decompression, the decompression system interprets the indicators and codes inserted into the data stream by the compression system. In this example, the data stream is decompressed by interpreting the indicators and codes in the data stream and shifting the decompressed data into a FIFO 700, illustrated in FIG. 7A. The length of the FIFO used for decompression must be greater than or equal to the length of the FIFO used for compression.

Turning again to FIG. 6, the MSB of the first byte in the data stream 610 indicates whether the byte is an indicator for a non-repeating sequence or a code for a repeating sequence. In this case, a 0 in the MSB of the byte 610 identifies the byte as a non-repeating data sequence indicator. The 7 LSBs of the indicator byte 610 represent the length of the non-repeating data sequence 620 following the indicator. In this example, the 7 LSBs of the indicator byte 610 contain 0010011, decimal 19, to which 1 is added in one implementation to get decimal 20, indicating that the literal sequence 620 following the indicator byte 610 is 20 bytes in length. The indicator byte 610 is removed from the data stream by the decompression system and the 20 byte literal sequence 620 is shifted into a decompression FIFO 700 illustrated in FIG. 7.

After the 20 byte literal sequence 620 is shifted into the decompression FIFO, the next byte 631 is processed. The MSB of byte 631 is a 1, which identifies this as the first byte of a two-byte code 630. The code characterizes a repeating sequence that may be identified by a length and a location of an identical sequence in the FIFO.

The length of the repeating sequence characterized by the code 630 is contained in the 7 LSBs of the first code byte 631. The location of the repeating sequence in the FIFO is contained in the 8 bits of the second code byte 632.

In this example, the 7 LSBs of the first code byte 631 contains 000100, decimal 4 to which 1 is added in one implementation to get decimal 5, indicating that the repeating sequence is 5 bytes in length. The 8 bits of the second code byte 632 identify the location of the repeating sequence in the decompression FIFO 700 illustrated in FIG. 7A. The second code byte 632 contains 00000110, decimal 6, indicating the first location of the repeating sequence is the sixth position 720 of the FIFO 700 illustrated in FIG. 7A. The 5-byte sequence AEAAA, contained in the FIFO 700 beginning with the sixth position 720 of the FIFO 700 and extending for five bytes, is shifted into the decompression FIFO.

FIG. 7B illustrates the 20-byte decompression FIFO 700 following the operations described above. The first 5 bytes in the buffer fall out of the FIFO as the 5-byte sequence is shifted into the FIFO.

Figure 8A:
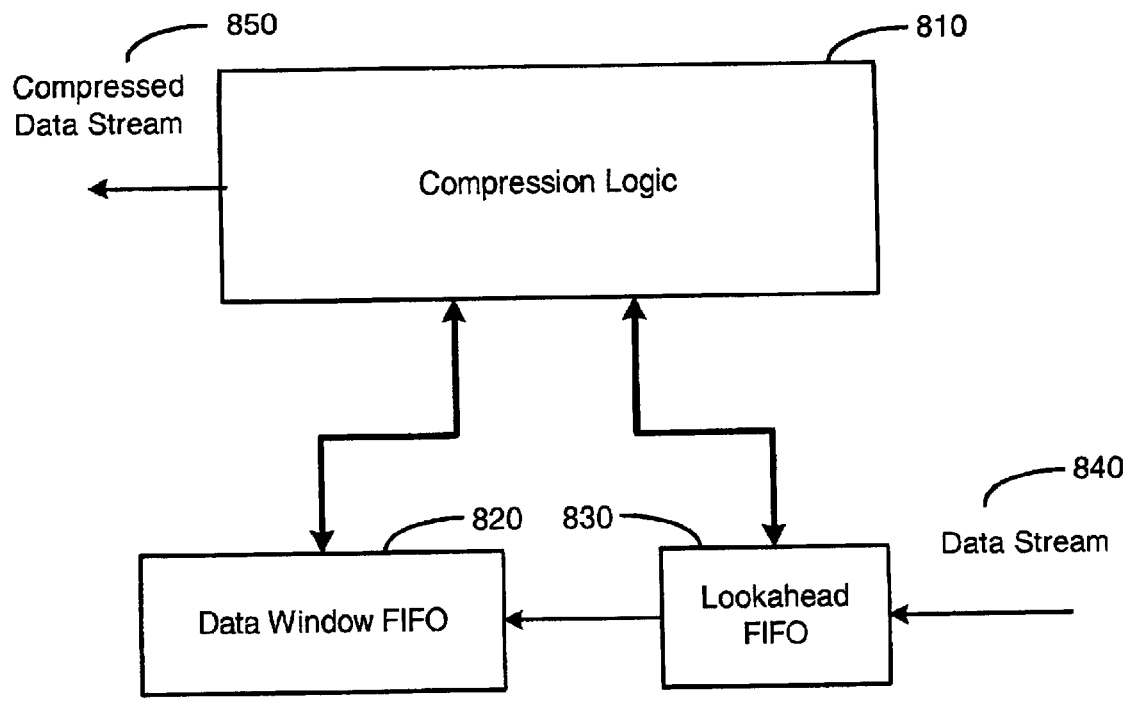
FIG. 8A is a block diagram of a system for compressing a data stream in accordance with an embodiment of the invention.

A block diagram of a system for compressing a data stream in accordance with an embodiment of the present invention is illustrated in FIG. 8A. The system includes compression logic 810 configured to control the process of compression, a data FIFO 820, and a look-ahead FIFO 830. Data from the data stream 840 is shifted through the look-ahead FIFO 830 and into the data FIFO 820. The data in the data FIFO 830 is examined for sequences that are repeated in the look-ahead FIFO 820. Repeating sequences are identified and encoded using the location of the repeating sequence in the data FIFO and the length of the repeating sequence. The codes characterizing the repeating sequences are inserted into the compressed data stream 850 in place of the repeating sequences. Data in the FIFO 820 that are not part of a repeating sequence in FIFO 830 are considered literal sequences. The indicators and literal data are inserted into the compressed data stream 850.

Figure 8B:
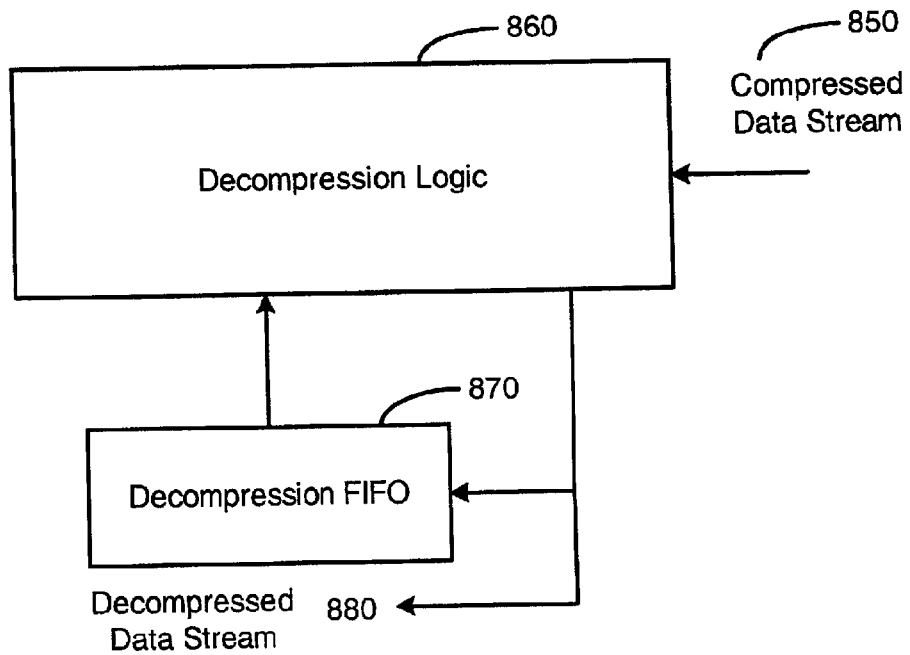
FIG. 8B is a block diagram of a system for decompressing a data stream in accordance with an embodiment of the invention.

FIG. 8B illustrates a block diagram of a system for decompressing a compressed data stream. The decompression system includes decompression logic 860, configured to control the process of decompression, and a decompression FIFO 870. The compressed data stream 850 includes indicators and codes that are detected by the decompression logic 860. The indicators are removed from the data stream and the literal sequences are shifted in to the decompression FIFO 870. Codes characterizing repeating sequences in the compressed data stream are detected and decoded by the decompression logic 860. The repeating sequences characterized by the codes are inserted in place of the codes and shifted into the decompression FIFO 870. Data shifted into the FIFO 870 is decompressed data 880.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for compressing a data block, comprising:
   replacing repeating sequences in the data block with codes, each code characterizing a repeating sequence; and
   inserting indicators into the data block, each indicator characterizing a non-repeating sequence of variable length.

2. The method of claim 1, wherein replacing repeating sequences in the data block with codes further comprises:
   defining a first portion and a second portion of the data block;
   comparing sequences in the first portion and the second portion;
   identifying sequences in the second portion that repeat sequences in the first portion; and
   replacing the repeating sequences with the codes characterizing the repeating sequences.

3. The method of claim 2, wherein defining the first portion and the second portion of the data block further comprises:
   forming a first sliding window of the data block including the first portion; and
   forming a second sliding window of the data block including the second portion.

4. The method of claim 2, wherein defining the first portion and the second portion further comprises defining non-overlapping and consecutive first and second portions in the data block.

5. The method of claim 1, wherein each code characterizes a repeating sequence by:
   identifying the code with a code flag;
   indicating a length of a sequence in the data block repeated by the repeating sequence; and
   indicating a location of the sequence repeated by the repeating sequence.

6. The method of claim 5, wherein indicating the location of the sequence comprises indicating the location of the sequence in a first portion of the data block.

7. The method of claim 5, wherein indicating the location of the sequence comprises identifying a physical address of the sequence in a first portion of the data block.

8. The method of claim 1, wherein each indicator characterizes a non-repeating sequence by:
   identifying the indicator with an indicator flag; and
   indicating a length of the non-repeating sequence characterized by the indicator.

9. The method of claim 1, wherein inserting the indicators into the data block comprises inserting each indicator immediately before the non-repeating sequence characterized by the indicator.

10. A method for decompressing a data block, comprising:
    replacing codes in the data block with repeating sequences characterized by the codes; and
    removing indicators characterizing non-repeating sequences of variable length from the data block.

11. The method of claim 10, wherein replacing codes in the data block further comprises:
    recognizing each code characterizing a repeating sequence by a code flag in the code;
    extracting a length of a sequence repeated by the repeating sequence from the code;
    extracting a location of the sequence repeated by the repeating sequence from the code; and
    replacing the code with the sequence.

12. The method of claim 11, wherein extracting a location of the sequence further comprises identifying the location of the sequence in a decompression buffer.

13. The method of claim 11, wherein replacing the code with the sequence further comprises inserting the sequence into a decompression buffer.

14. The method of claim 10, wherein removing indicators characterizing non-repeating sequences further comprises recognizing each indicator by an indicator flag in the indicator.

15. The method of claim 14, further comprising placing each non-repeating sequence into a decompression buffer.

16. A method for compressing a data stream, comprising:
    identifying repeating sequences in the data stream;
    forming codes, each code characterizing a repeating sequence;
    placing the codes into a compressed data stream;
    forming indicators, each indicator characterizing a non-repeating sequence of variable length in the data stream;
    placing the indicators into the compressed data stream; and
    placing the non-repeating sequences into the compressed data stream.

17. The method of claim 16, wherein identifying repeating sequences further comprises:
    defining a first portion and a second portion of the data stream;
    comparing sequences in the first portion and the second portion; and
    identifying sequences in the second portion that repeat sequences in the first portion.

18. The method of claim 17, wherein defining the first portion and the second portion of the data stream further comprises:
    forming a first sliding window of the data stream including the first portion; and
    forming a second sliding window of the data stream including the second portion.

19. The method of claim 17, wherein defining the first portion and the second portion further comprises defining non-overlapping and consecutive first and second portions in the data stream.

20. The method of claim 16, wherein each code characterizes a repeating sequence by:
    identifying the code with a code flag;
    indicating a length of a sequence repeated by the repeating sequence; and
    specifying a location of the sequence repeated by the repeating sequence.

21. The method of claim 20, wherein specifying the location of the sequence comprises identifying the location of the sequence in a buffer.

22. The method of claim 20, wherein specifying the location of the sequence further comprises identifying a physical address of the sequence in a buffer.

23. The method of claim 16, wherein each indicator characterizes a non-repeating sequence by:

identifying the indicator with an indicator flag; and indicating a length of the non-repeating sequence characterized by the indicator.

24. The method of claim 16, wherein placing the indicators into the compressed data stream comprises inserting each indicator into the compressed data stream immediately before the non-repeating sequence characterized by the indicator.

25. A method for decompressing a compressed data stream, comprising:

removing indicators from the compressed data stream, each indicator characterizing a non-repeating data sequence of variable length; and replacing codes in the compressed data stream with repeating sequences characterized by the codes.

26. The method of claim 25, wherein replacing codes in the compressed data stream with repeating sequences comprises:

recognizing each code by a code flag in the code, the code flag signaling that a repeating sequence characterized by the code has been replaced in the compressed data stream by the code;

extracting from the code a length of a sequence repeated by the repeating sequence;

extracting from the code a location of the sequence repeated by the repeating sequence in a decompression buffer; and inserting the sequence into the decompression buffer in place of the code.

27. The method of claim 26, wherein extracting from the code the location of the sequence comprises extracting from the code a physical address of the sequence in the decompression buffer.

28. The method of claim 25, wherein removing the indicators from the compressed data stream further comprises:

identifying non-repeating sequences in the compressed data stream by recognizing indicator flags in the indicators; and inserting the non-repeating sequences into a decompression buffer.

29. The method of claim 28, wherein each indicator identifies a length of the non-repeating sequence characterized by the indicator.

30. An apparatus for compressing a data block, comprising:

a storage element for storing a first and a second portion of the data block; and a compression circuit arrangement configured to replace repeating sequences in the data block with codes characterizing the repeating sequences and inserting indicators characterizing non-repeating sequences of variable length into the data block.

31. The apparatus of claim 30, wherein the compression circuit arrangement is configured to form a first sliding window in the data block for storing the first portion, and to form a second sliding window in the data block for storing the second portion of the data block.

32. The apparatus of claim 30, wherein the storage element comprises:

a first FIFO circuit for storing the first portion of the data block; and a second FIFO circuit for storing the second portion of the data block.

33. The apparatus of claim 30, wherein locations of the first portion and the second portion are identified by a first memory location register and a second memory location register, respectively.

34. The apparatus of claim 30, wherein the compression circuit arrangement is further configured to:

compare sequences in the first portion and the second portion;

identify sequences in the second portion that repeat sequences in the first portion as repeating sequences; and replace the repeating sequences with codes characterizing the repeating sequences in the data block.

35. The apparatus of claim 30, wherein the compression circuit arrangement is configured to form a code characterizing each repeating sequence, the code comprising:

a code flag, the code flag signaling that the repeating sequence characterized by the code has been replaced in the data block by the code;

a length of a sequence repeated by the repeating sequence; and a location of the sequence repeated by the repeating sequence.

36. The apparatus of claim 35, further wherein the sequence is located in the first portion of the data block.

37. The apparatus of claim 35, wherein a length of the code is a predetermined number of data units.

38. The apparatus of claim 37, wherein the predetermined number of data units is two bytes.

39. The apparatus of claim 35, wherein the code flag and the length of the sequence are contained in a first data unit of the code and the location of the sequence is located in a second data unit of the code.

40. The apparatus of claim 35, wherein the location of the sequence is a physical address in a buffer.

41. The apparatus of claim 30, wherein the compression circuit arrangement is configured to form an indicator characterizing each non-repeating sequence, the indicator comprising:

an indicator flag, the indicator flag signaling that the non-repeating sequence follows the indicator in the compressed data block; and a length of the non-repeating sequence.

42. The apparatus of claim 41, wherein a length of the indicator is a predetermined number of data units.

43. The apparatus of claim 42, wherein the predetermined number of data units is one byte.

44. An apparatus for decompressing a compressed data block, comprising a decompression circuit arrangement configured to:

restore repeating sequences, the repeating sequences characterized by codes in the compressed data block; and omit indicators in the compressed data block, each indicator characterizing a non-repeating sequence of variable length.

45. The apparatus of claim 44, wherein each code comprises:

a code flag, the code flag signaling that the repeating sequence characterized by the code has been replaced in the compressed data block by the code;

a length of a sequence repeated by the repeating sequence; and a location of the sequence repeated by the repeating sequence.

46. The apparatus of claim 45, wherein the sequence repeated by the repeating sequence is located in a decompression buffer.

47. The apparatus of claim 45, wherein the location of the sequence is a physical address in a decompression buffer.

48. The apparatus of claim 45, wherein the decompression circuit arrangement is configured to:
   recognize each code by the code flag;
   identify the sequence repeated by the repeating sequence by the length and the location of the sequence; and
   insert the sequence into the compressed data block in place of the code.

49. The apparatus of claim 44, wherein the decompression circuit arrangement is configured to replace each code in a decompression buffer with the sequence characterized by the code.

50. The apparatus of claim 44, wherein each indicator comprises:
   an indicator flag, the indicator flag signaling that the non-repeating sequence characterized by the indicator follows the indicator in the compressed data block; and
   a length of the non-repeating sequence characterized by the indicator.

51. The apparatus of claim 50, wherein the decompression circuit arrangement is configured to:
   recognize each indicator by the indicator flag; and
   remove the indicator from the compressed data block.

52. The apparatus of claim 51, wherein the decompression circuit arrangement is further configured to copy the non-repeating sequence into a decompression buffer.

53. A system for compressing a data block, comprising:
   means for replacing repeating sequences in the data block with codes, each code characterizing a repeating sequence; and
   means for inserting indicators into the data block, each indicator characterizing a non-repeating sequence of variable length.

54. A system for decompressing a compressed data block comprising:
   means for replacing each code in the compressed data block with a repeating sequence characterized by the code; and
   means for removing indicators characterizing non-repeating sequences of variable length from the compressed data block.

55. A system for compressing a data stream, comprising:
   means for identifying repeating sequences in the data stream;
   means for forming codes, each code characterizing a repeating sequence;
   means for placing the codes into a compressed data stream;
   means for forming indicators, each indicator characterizing a non-repeating data sequence of variable length in the data stream;
   means for placing the indicators into the compressed data stream; and
   means for placing non-repeating sequences into the compressed data stream.

56. A system for decompressing a compressed data stream, comprising:
   means for removing indicators from the compressed data stream, each indicator characterizing a non-repeating sequence of variable length; and
   means for replacing codes in the compressed data stream with repeating sequences characterized by the codes.

57. A computer-readable medium configured with executable instructions for causing one or more computers to perform a method of compressing a data block, the method comprising:
   replacing repeating sequences in the data block with codes, each code characterizing a repeating sequence; and
   inserting indicators into the data block, each indicator characterizing a non-repeating sequence of variable length.

58. A computer-readable medium configured with executable instructions for causing one or more computers to perform a method of decompressing a compressed data block, the method comprising:
   replacing each code in the compressed data block with a repeating sequence characterized by the code; and
   removing indicators characterizing non-repeating sequences of variable length from the compressed data block.

* * * * *